United States Patent [19]
Mandai et al.

[11] Patent Number: 5,495,387
[45] Date of Patent: Feb. 27, 1996

[54] RC ARRAY

[75] Inventors: Harufumi Mandai; Yoshikazu Chigodo; Kazuhiro Iida, all of Kyoto, Japan

[73] Assignee: Murata Manufacturing Co., Ltd., Japan

[21] Appl. No.: 271,263

[22] Filed: Jul. 6, 1994

Related U.S. Application Data

[63] Continuation of Ser. No. 927,119, Aug. 7, 1992, abandoned.

[30] Foreign Application Priority Data

Aug. 9, 1991 [JP] Japan ................................ 3-200204
Aug. 9, 1991 [JP] Japan ................................ 3-200205
Aug. 9, 1991 [JP] Japan ................................ 3-200206

[51] Int. Cl.$^6$ ........................ H01G 4/38; H01G 4/228; H01G 2/20; H03H 7/00
[52] U.S. Cl. ............... 361/328; 361/306.1; 361/306.3; 361/308.1; 361/330; 333/172
[58] Field of Search ............................. 333/184, 185

[56] References Cited

U.S. PATENT DOCUMENTS

| | | | |
|---|---|---|---|
| 3,329,921 | 7/1967 | Badelt | 338/313 |
| 3,859,592 | 1/1975 | Kessler | 333/79 |
| 4,074,340 | 2/1978 | Leigh | 361/330 |
| 4,267,634 | 5/1981 | Wellard | 29/620 |
| 4,302,737 | 11/1981 | Kausche et al. | 333/172 |
| 4,412,209 | 10/1983 | Frame et al. | 340/365 C |
| 4,466,045 | 8/1984 | Coleman | 361/277 |
| 4,746,557 | 5/1988 | Sakamoto | 333/184 |
| 4,856,102 | 8/1989 | Insetta | 361/330 |
| 4,904,967 | 2/1990 | Morii et al. | 333/185 |
| 4,947,286 | 8/1990 | Kaneko et al. | 361/330 |
| 5,157,582 | 10/1992 | Sugita et al. | 361/321 |

FOREIGN PATENT DOCUMENTS 1316919 12/1989 Japan ................................ 361/321.2

*Primary Examiner*—Bot L. Ledynh
*Attorney, Agent, or Firm*—Ostrolenk, Faber, Gerb & Soffen

[57] ABSTRACT

A plurality of capacitor elements defined by first and second capacitor electrodes are formed in the interior of a laminated ceramic block, while a plurality of first terminal electrodes to be electrically connected to the first capacitor electrodes and a ground terminal electrode to be connected to the second capacitor electrodes in common are formed on one side surface of the block. A plurality of resistor films are formed on a major surface of the block, to be connected to the first terminal electrodes. A plurality of second terminal electrodes are formed on another side surface of the block, to be electrically connected to the resistor films. Another ground terminal electrode is formed on this side surface, to be connected to the second capacitor electrodes in common. Thus, an RC array being applicable to a high frequency filter array is integrated and miniaturized to cope with high density packaging, as well as to enable surface mounting.

9 Claims, 13 Drawing Sheets

RC ARRAY

This is a continuation of application Ser. No. 07/927,119 filed on Aug. 7, 1992, now abandoned.

BACKGROUND OF THE INVENTION

1. Field of the Invention

The present invention relates to an RC array which includes a plurality of capacitor elements and a plurality of resistor elements, and more particularly, it relates to an improvement for providing such an RC array as an integrated component.

2. Description of the Background Art

A filter array is inserted between a ground and several integrated circuit elements which are included in a computer, for example, to eliminate noises from signals. Such a filter array is formed by a plurality of filter circuits, being ground-connected in common, each of which includes at least one capacitor element and at least one resistor element. Each filter circuit is respectively connected to one of a plurality of pins provided in the integrated circuit elements.

FIG. 8 shows an example of such a filter array 1. This filter array 1 comprises a plurality of, e.g., eight capacitor elements 2, while one terminal of each capacitor element 2 is electrically connected to a first terminal 3. This terminal of each capacitor element 2 is also connected with one terminal of each of a plurality of resistor elements 4, while the other terminal of each resistor element 4 is electrically connected to a second terminal 5. The other terminals of the capacitor elements 2 are connected in common, to be electrically connected to ground terminals 6.

The filter array 1 shown in FIG. 8 is most typically formed by a combination of discrete components such as a plurality of capacitor components defining the capacitor elements 2 and a plurality of resistor components defining the resistor elements 4. When the filter array 1 is formed by combining a plurality of such discrete components, the packaging area occupied by the filter array 1 is increased and an operation for preparing the filter array 1 is complicated.

In order to solve the aforementioned problem, there has been proposed an R array which is prepared by printing a plurality of resistor films on an alumina substrate and arranging a capacitor component on the substrate to be electrically connected to the corresponding R array, for example. On the other hand, an SOP package, which is obtained by packaging such a substrate and capacitor component, has been put into practice. However, this technique cannot sufficiently satisfy the requirement for miniaturization of the array.

SUMMARY OF THE INVENTION

Accordingly, an object of the present invention is to provide an RC array which can form the aforementioned filter array as a single component, thereby resulting in sufficient miniaturization of the array.

An RC array according to the present invention comprises a laminated ceramic block. Pairs of first and second capacitor electrodes are formed in the interior of this block to be opposite to each other, thereby defining a plurality of capacitor elements. On the other hand, a plurality of first terminal electrodes, a plurality of second terminal electrodes, a ground terminal electrode, and a plurality of resistor films are formed on outer surfaces of the block. The plurality of first terminal electrodes are electrically connected to the first capacitor electrodes of the capacitor elements, respectively. Further, first ends of the resistor films are electrically connected to the first terminal electrodes, respectively. Second ends of the resistor films are electrically connected to the second terminal electrodes, respectively. On the other hand, the second capacitor electrodes of the plurality of capacitor elements are connected in common by a coupling conductor, to be electrically connected to the ground terminal electrode through the coupling conductor.

According to the present invention, it is possible to form a circuit which is defined by the filter array 1 shown in FIG. 8, for example, by an RC array which is formed by a single laminated ceramic block and can be handled as a single component.

According to the present invention, therefore, it is possible to miniaturize an RC array, thereby allowing high density packaging in an apparatus employing such an RC array.

When the block has a pair of major surfaces which are parallel to each other and four side surfaces extending in directions perpendicular to the major surfaces so that the first terminal electrodes, the second terminal electrodes and the ground terminal electrode include portions extending on any of the four side surfaces and the resistor films are formed on one of the major surfaces, the inventive RC array can be handled as a surface-mountable component. Thus, the present invention can further contribute to high density packaging.

According to the present invention, it is also possible to provide an RC array which defines a circuit other than that shown in FIG. 8, by partially modifying the aforementioned specific order of connection or adding new elements.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
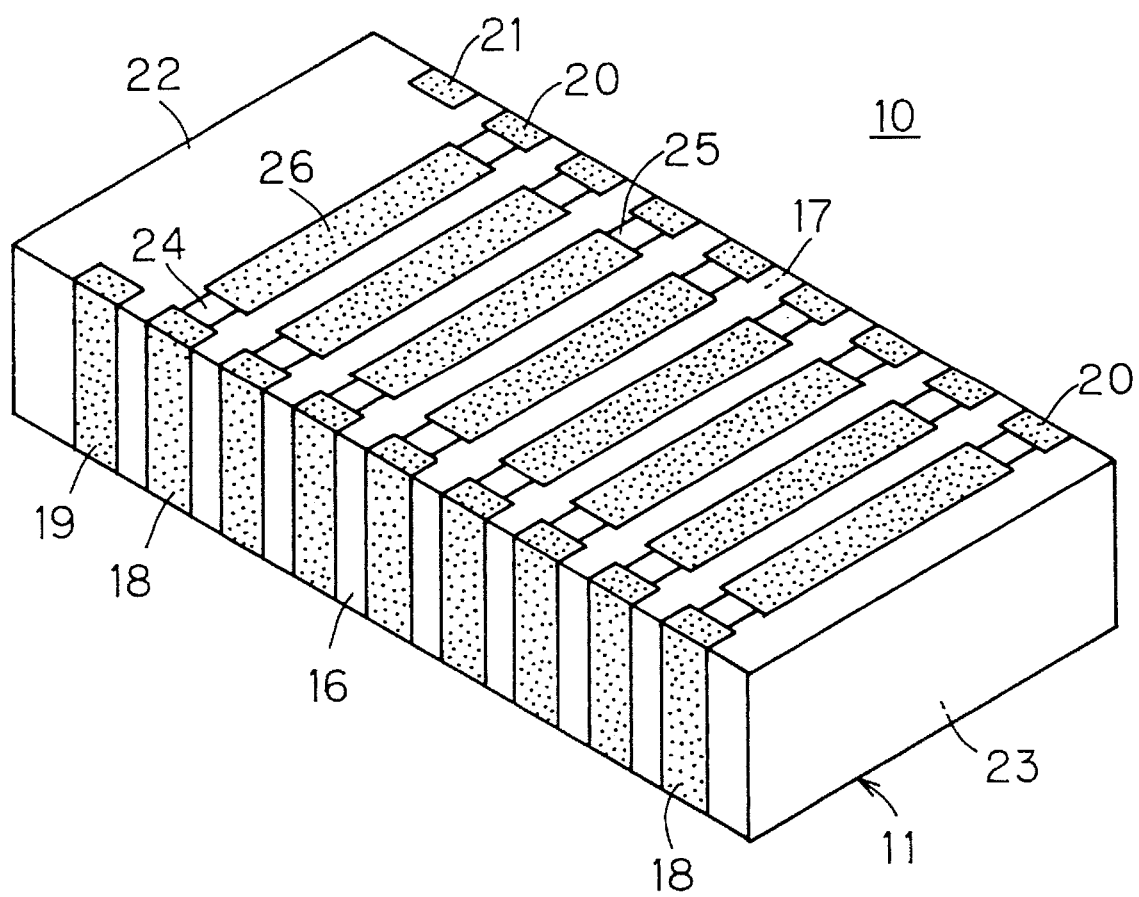
FIG. 1 is a perspective view showing an RC array 10 according to an embodiment of the present invention.

FIGS. 1 to 4 illustrate an embodiment of the present invention. FIG. 1 is a perspective view showing the appearance of an RC array 10 according to this embodiment. Such an RC array 10 can be advantageously applied to a high frequency filter array which is employed for a circuit of a computer or the like.

Figure 2:
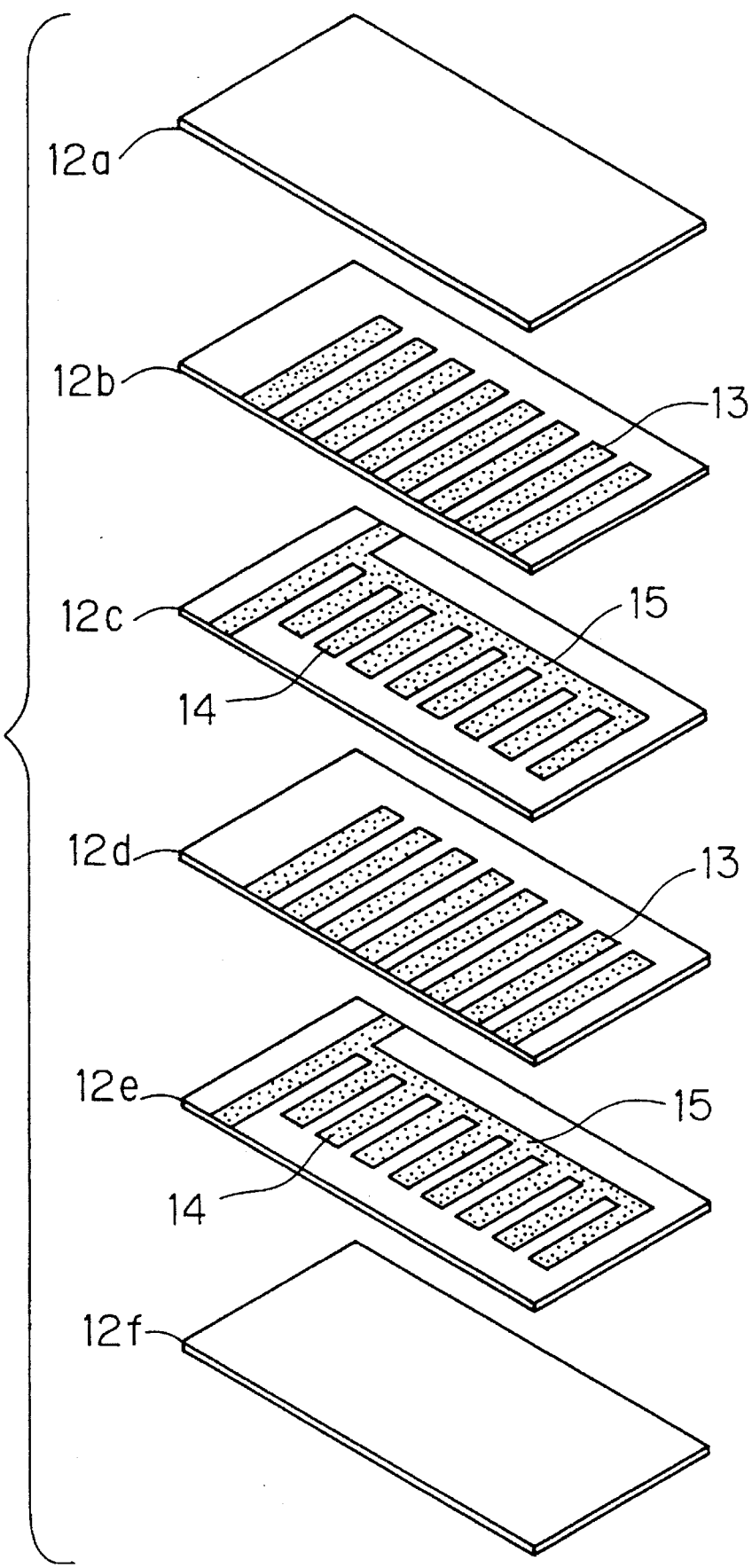
FIG. 2 is an exploded perspective view individually showing a plurality of ceramic sheets 12a to 12f forming a laminated ceramic block 11 shown in FIG. 1.

The RC array 10 comprises a laminated ceramic block 11, which is obtained by laminating a plurality of ceramic sheets 12a–12f, as shown in FIG. 2. In order to obtain the ceramic sheets 12a–12f, a ceramic green sheet containing a dielectric ceramic material and a binder is punched into prescribed sizes. A plurality of, e.g., eight, first capacitor electrodes 13 are formed on each of the ceramic sheets 12b and 12d by printing, for example, to be parallel to each other. The first capacitor electrodes 13 extend toward first side edges of the ceramic sheets 12b and 12d, respectively. On the other hand, second capacitor electrodes 14 are formed on the ceramic sheets 12c and 12e, to be positioned opposite to the first capacitor electrodes 13 respectively. The second capacitor electrodes 14 are connected in common by coupling conductors 15, which extend toward both side edges of the ceramic sheets 12c and 12e. The second capacitor electrodes 14 and the coupling conductors 15 are simultaneously formed by printing, for example.

Figure 3:
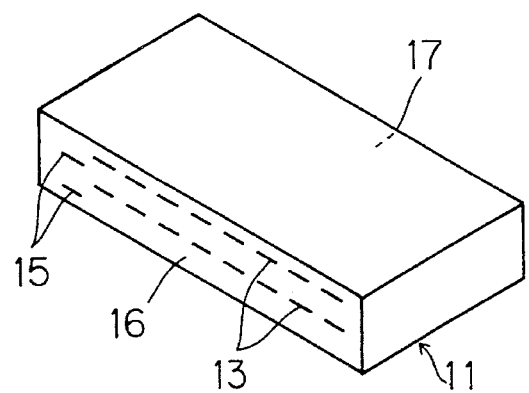
FIG. 3 is a perspective view showing the laminated ceramic block 11 obtained by laminating the ceramic sheets 12a to 12f shown in FIG. 2.

The ceramic sheets 12a–12f are laminated in the order shown in FIG. 2, and brought into pressure contact with each other. FIG. 3 illustrates the as-obtained block 11. The first capacitor electrodes 13 and the coupling conductors 15 are exposed on a side surface 16 of the block 11. The other ends (not shown) of the coupling conductors 15 are also exposed on another side surface 17 which is opposite to the side surface 16. The block 11 is fired at a temperature of 1200° to 1300° C., for example, to provide a sintered body.

In the process of obtaining the block 11, the ceramic sheets 12d and 12e, for example, may be omitted so that capacitor elements are defined simply by single pairs of the first and second capacitor electrodes 13 and 14. Alternatively, ceramic sheets corresponding to the ceramic sheets 12b and 12c or 12d and 12e may be further laminated to increase the number of pairs of the first and second capacitor electrodes 13 and 14 for defining capacitor elements.

Figure 4:
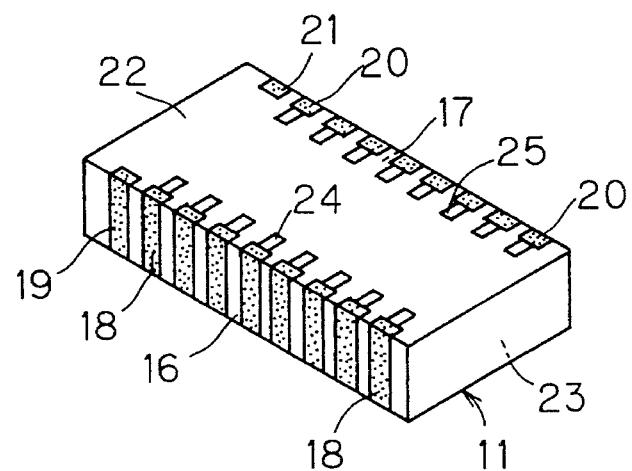
FIG. 4 is a perspective view showing terminal electrodes 18 to 21 formed on outer surfaces of the laminated ceramic block 11 shown in FIG. 3.

Then, a plurality of, e.g., eight, first terminal electrodes 18 and a ground terminal electrode 19 are formed on the side surface 16 of the block 11, as shown in FIG. 4. On the other hand, a plurality of, e.g., eight, second terminal electrodes 20 and another ground terminal electrode 21 are formed on the other side surface 17 of the block 11. The terminal electrodes 18, 19, 20 and 21 are preferably formed to partially extend toward opposite major surfaces 22 and 23 of the block 11. First and second land electrodes 24 and 25 are formed on the major surface 22 of the block 11, to be electrically connected to the first and second terminal electrodes 18 and 20, respectively. The electrodes 18–21, 24 and 25 are formed by printing proper conductive paste materials and baking the same. The land electrodes 24 and 25 may be formed in any stage before or after formation of the terminal electrodes 18–21, or the electrode 24 and 25 may alternatively be omitted.

Then, resistor films 26 are formed on the major surface 22 of the block 11, to extend between the first land electrodes 24 and the corresponding ones of the second land electrodes 25, as shown in FIG. 1. The resistor films 26 are formed by printing cermet materials, for example, and baking the same. These resistor films 26 are trimmed if necessary, while the same may be covered with overcoats of resin, for example.

Figure 8:
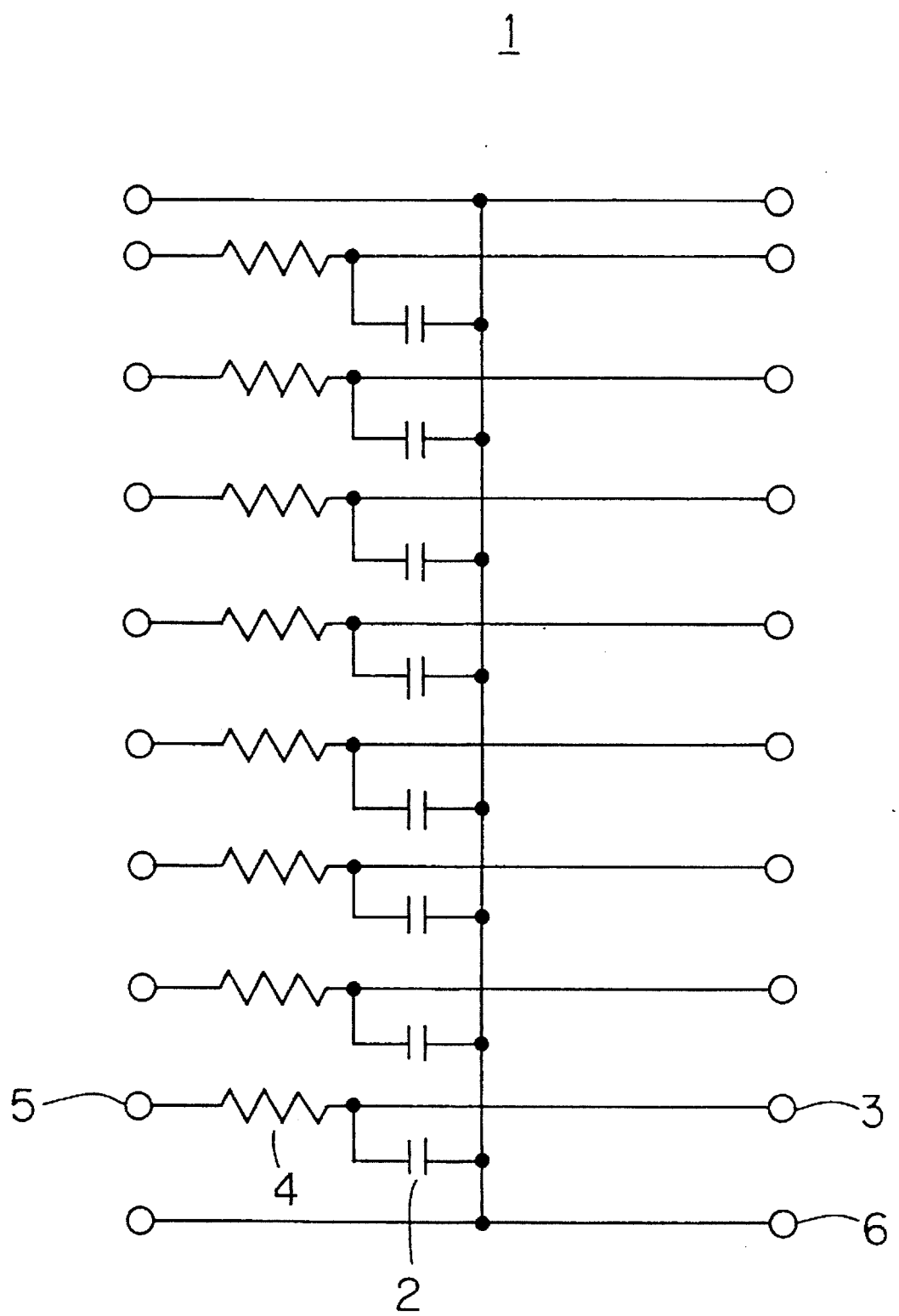
FIG. 8 is a circuit diagram showing a filter array 1 defined by the RC array 10 shown in FIG. 1.

The as-obtained RC array 10 defines a circuit forming the filter array 1 shown in FIG. 8. Namely, the first and second capacitor electrodes 13 and 14 define the capacitor elements 1, while the resistor films 26 define the resistor elements 4. Further, the first capacitor electrodes 13 are electrically connected to the first terminal electrodes 18, which define the first terminals 3. The second capacitor electrodes 14 are connected in common through the coupling conductor 15, to be electrically connected to the ground terminals 19 and 21, which define the ground terminals 6. The first terminal electrodes 18 are electrically connected to the resistor films 26 through the first land electrodes 24, while the second terminal electrodes 20, which are electrically connected to the resistor films 26 through the second land electrodes 25, define the second terminals 5.

Such an RC array 10 can be formed as a chip component of 8 mm by 4 mm by 1 mm in size, for example.

Figure 5:
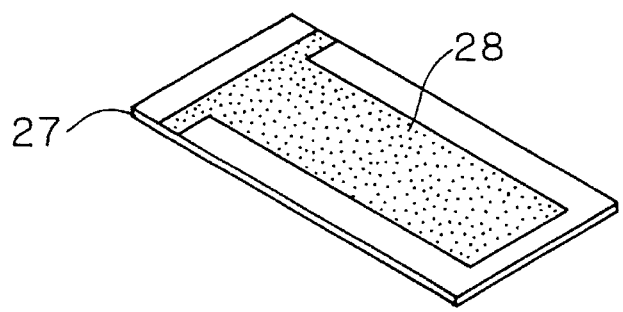
FIG. 5 is a perspective view showing a ceramic sheet 27 according to another embodiment of the present invention, which can substitute for the ceramic sheet 12c or 12e shown in FIG. 2.

FIG. 5 shows a ceramic sheet 27, which can substitute for the ceramic sheet 12c or 12e shown in FIG. 2. An electrode 28 which is formed on this ceramic sheet 27 defines the second capacitor electrodes 14 and the coupling conductor 15 shown in FIG. 2 in an unseparated manner with a continuous shape. Thus, the electrode 28 serves partially as a second capacitor, and partially as a coupling conductor.

Figure 6:
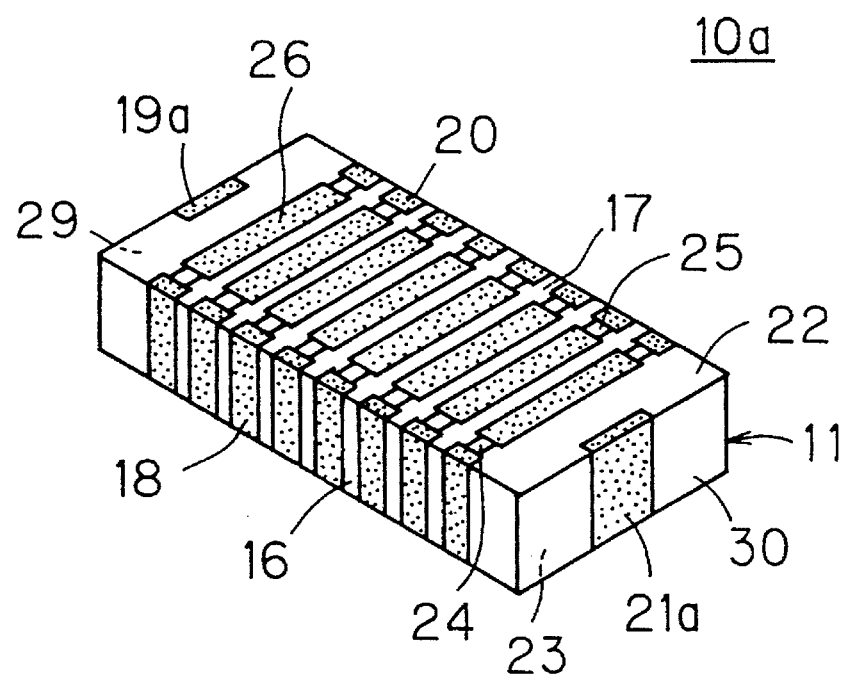
FIG. 6 is a perspective view showing an RC array 10a according to still another embodiment of the present invention.

FIG. 6 shows an RC array 10a according to still another embodiment of the present invention. Referring to FIG. 6, elements corresponding to those shown in FIG. 1 are denoted by similar reference numerals to omit redundant description.

Figure 7:
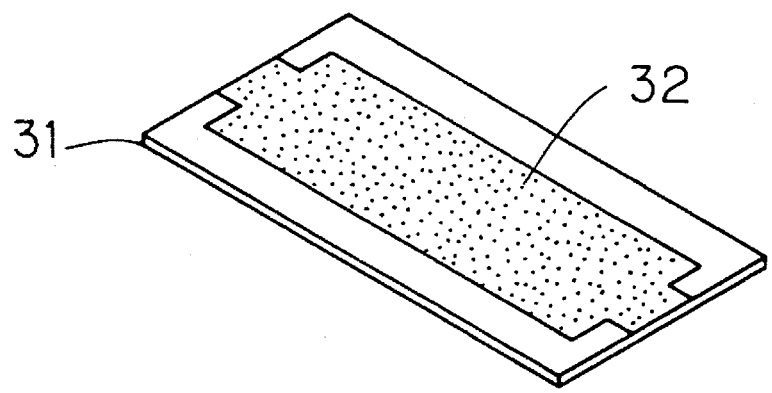
FIG. 7 is a perspective view showing a ceramic sheet 31 which is employed in place of the ceramic sheet 12c or 12e shown in FIG. 2 for forming the RC array 10a shown in FIG. 6.

In the embodiment shown in FIG. 6, ground terminal electrodes 19a and 21a are formed not on side surfaces 16 and 17 but on another pair of side surfaces 29 and 30 of a block 11, respectively. To enable such formation of the ground terminal electrodes 19a and 21a, a ceramic sheet 31 shown in FIG. 7 is employed in place of the ceramic sheet 12c or 12e shown in FIG. 2. An electrode 32 which is formed on this ceramic sheet 31 extends toward its shorter side edges. Similarly to the electrode 28 shown in FIG. 5, this electrode 31 serves both as a second capacitor electrode and a coupling conductor. The electrode 31 is exposed on the side surfaces 29 and 30, to be electrically connected to the ground terminals 19a and 21a, respectively.

Figure 9:
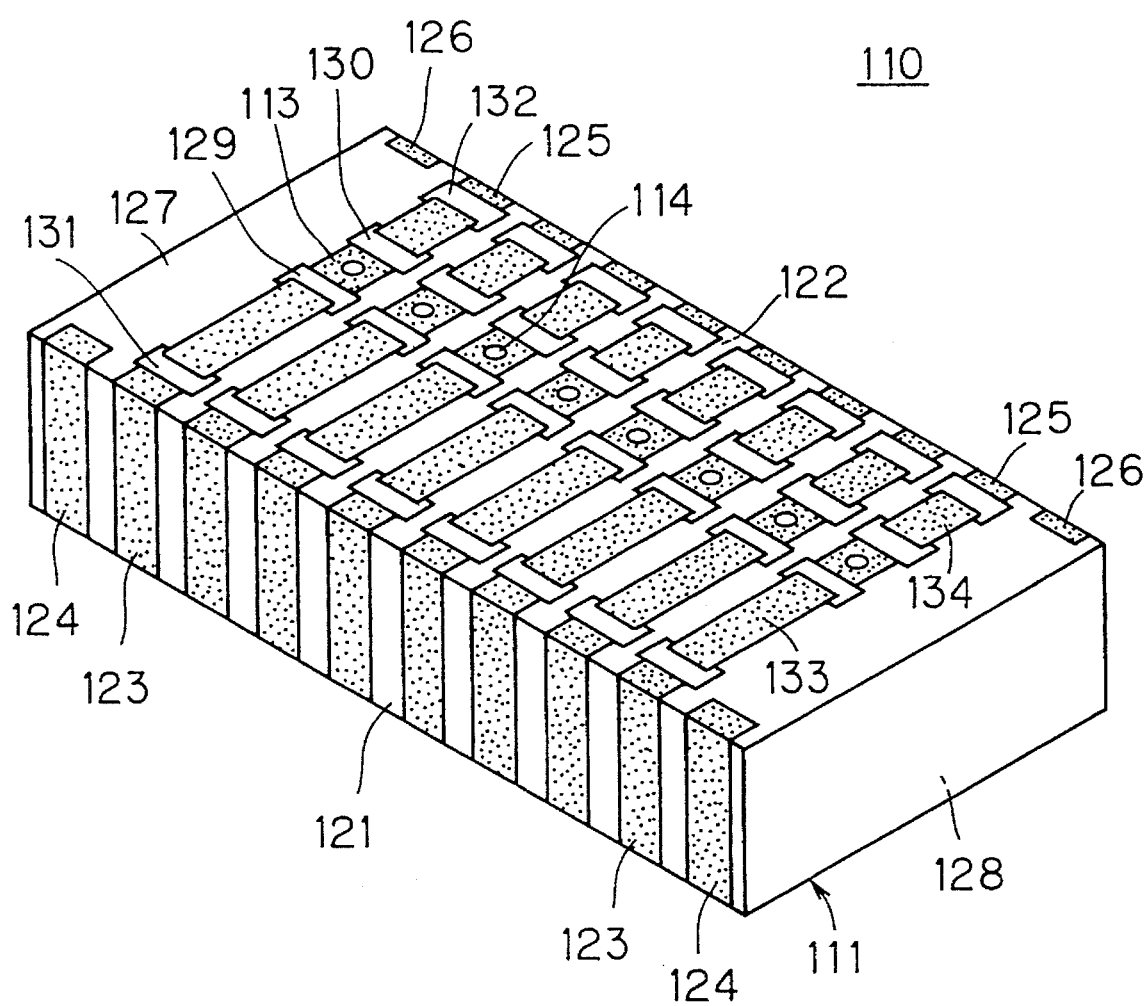
FIG. 9 is a perspective view showing an RC array 110 according to a further embodiment of the present invention.

FIGS. 9 to 12 illustrate a further embodiment of the present invention. FIG. 9 is a perspective view showing the appearance of an RC array 110 according to this embodiment.

Figure 10:
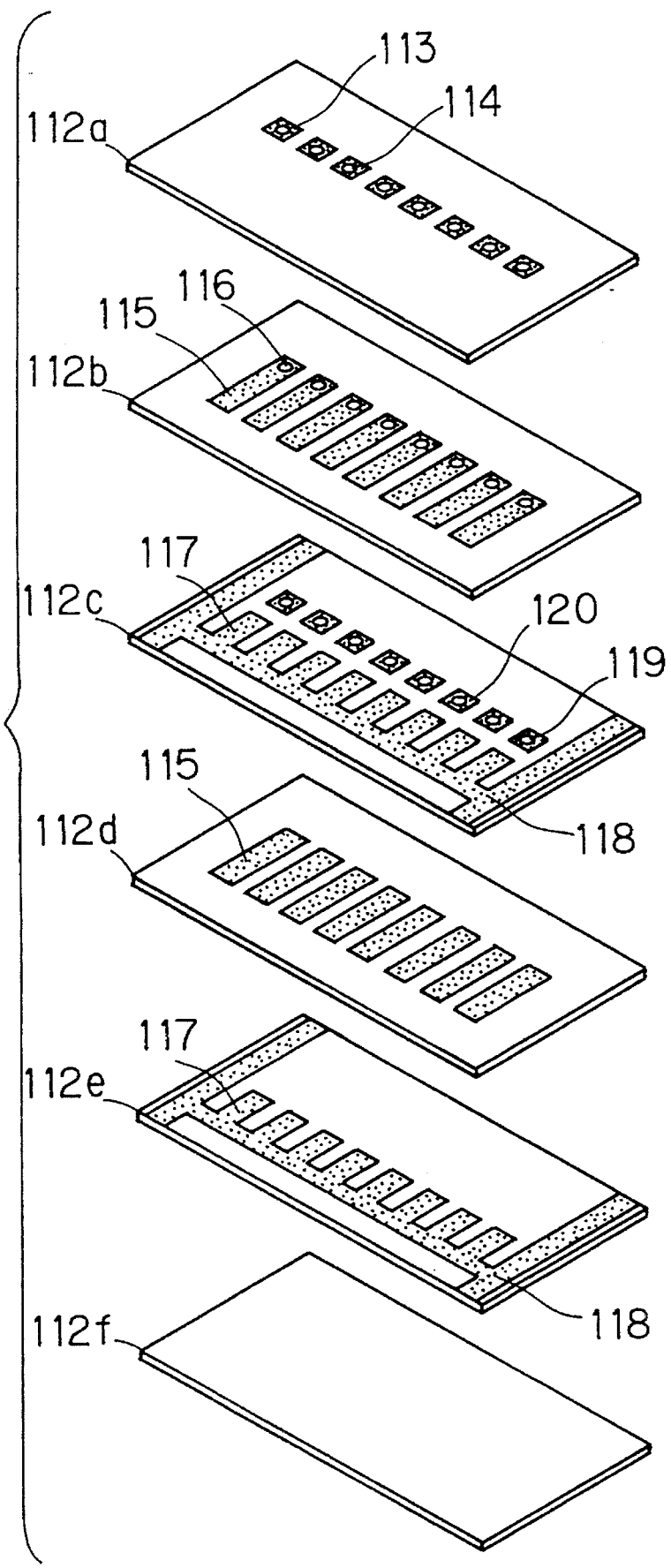
FIG. 10 is an exploded perspective view individually showing a plurality of ceramic sheets 112a to 112f forming a laminated ceramic block 111 shown in FIG. 9.

The RC array 110 comprises a laminated ceramic block 111, which is obtained by laminating a plurality of ceramic sheets 112a–to 112f, as shown in FIG. 10.

A plurality of, e.g., eight, tap electrodes 113 are formed side by side on the ceramic sheet 112a, and via holes 114 are formed in the tap electrodes 113, respectively. The tap electrodes 113 are formed by printing conductive paste materials, for example, so that these conductive paste materials are also applied into the via holes 114.

Eight first capacitor electrodes 115 are formed in parallel on the ceramic sheet 112b, in correspondence to the tap electrodes 113. Via holes 116 are formed in the first capacitor electrodes 115 respectively, in correspondence to the via holes 114. The first capacitor electrodes 115 are formed by printing, for example, so that conductive paste materials are also applied into the via holes 116 simultaneously with such printing.

Second capacitor electrodes 117 are formed on the ceramic sheet 112c, to be opposite to the first capacitor electrodes 115, respectively. These second capacitor electrodes 117 are connected in common by a coupling conductor 118, which extends toward both side edges on both ends of the ceramic sheet 112c. Further, via holes 119 are formed in the ceramic sheet 112c in correspondence to the aforementioned via holes 114 and 116, and via hole electrodes 120 are formed around the respective via holes 119. The second capacitor electrodes 117, the coupling conductor 118 and the via holes 120 are simultaneously formed by printing, for example, while conductive paste materials are applied into the via holes 119 in the process of such printing.

First capacitor electrodes 115 are formed on the ceramic sheet 112d, similarly to the ceramic sheet 112b. The first capacitor electrodes 115 formed on the ceramic sheet 112d are provided with no via holes.

Second capacitor electrodes 117 and a coupling conductor 118 are formed on the ceramic sheet 112e, similarly to the ceramic sheet 112c. The ceramic sheet 112e is provided with no via holes and no via hole electrodes.

On the other hand, no electrodes and no via holes are formed on the ceramic sheet 112f.

Figure 11:
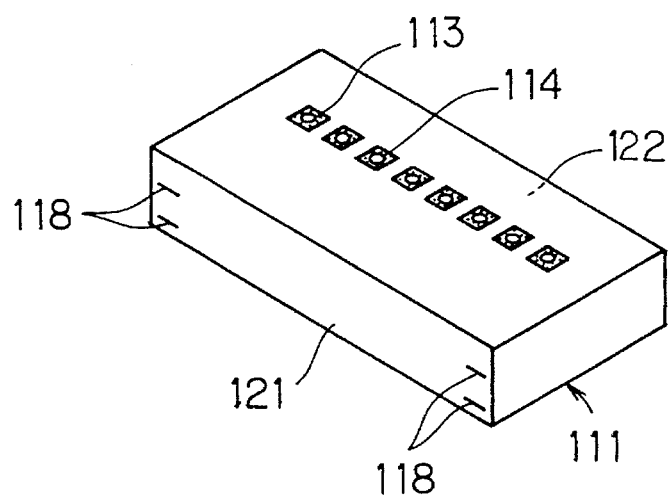
FIG. 11 is a perspective view showing the laminated ceramic block 111 obtained by laminating the ceramic sheets 112a to 112f shown in FIG. 10.

These ceramic sheets 112a–112f are laminated in the order shown in FIG. 10, and then brought into pressure contact with each other. FIG. 11 shows the as-formed block 111. The coupling conductors 118 are exposed on a side surface 121 of the block 111, while the other ends (not shown) of the coupling conductors 118 are exposed on another side surface 122 which is opposite to the side surface 121. The block 111 is fired at a temperature of 1200° to 1300° C., for example, to provide a sintered body.

In the process of obtaining the block 111, the ceramic sheets 112b and 112c, for example, may not be employed so that capacitor elements are defined simply by single pairs of the first and second capacitor electrodes 115 and 117. Alternatively, ceramic sheets corresponding to the ceramic sheets 112b and 112c may be further laminated to increase the number of pairs of the first and second capacitor electrodes 115 and 117 for defining capacitor elements.

Figure 12:
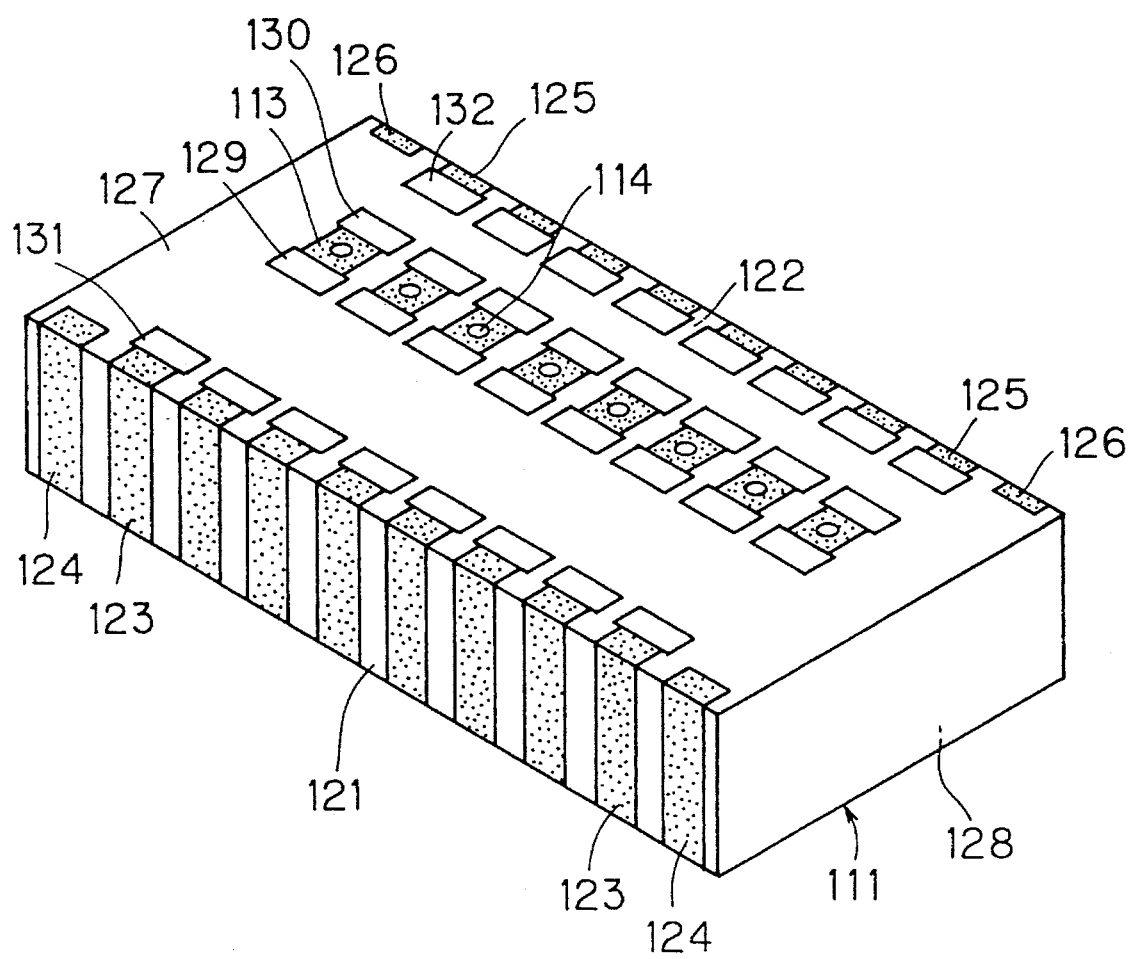
FIG. 12 is a perspective view showing terminal electrodes 123 to 126 formed on outer surfaces of the laminated ceramic block 111 shown in FIG. 11.

Then, a plurality of, e.g., eight, first terminal electrodes 123 and two ground terminal electrodes 124 are formed on the side surface 121 of the block 111, as shown in FIG. 12. On the other hand, a plurality of, e.g., eight, second terminal electrodes 125 and two ground terminal electrodes 126 are formed on the other side surface 122 of the block 111. The terminal electrodes 123, 124, 125 and 126 are preferably formed to partially extend toward opposite major surfaces 127 and 128 of the block 111.

First and second land electrodes 129 and 130, third land electrodes 131 and fourth land electrodes 132 are formed on the major surface 127 of the block 111, to be electrically connected to both ends of the respective tap electrodes 113, the first terminal electrodes 123 and the second terminal electrodes 125 respectively. These electrodes 123–126 and 129–132 are formed by printing proper conductive paste materials and baking the same. The land electrodes 129–132 may be formed in any stage before or after formation of the tap electrodes 113 and the terminal electrodes 123–126, or the land electrodes 129–132 may alternatively be omitted.

Then, first resistor films 133 are formed on the major surface 127 of the block 111 to extend between the first land electrodes 129 and the corresponding ones of the third land electrodes 131, as shown in FIG. 9. Further, second resistor films 134 are formed to extend between the second land electrodes 130 and the corresponding ones of the fourth land electrodes 132. These resistor films 133 and 134 are formed by printing cermet materials, for example, and baking the same. The resistor films 133 and 134 are trimmed if necessary, while the resistor films 133 and 134 may be covered with overcoats of resin, for example.

Figure 13:
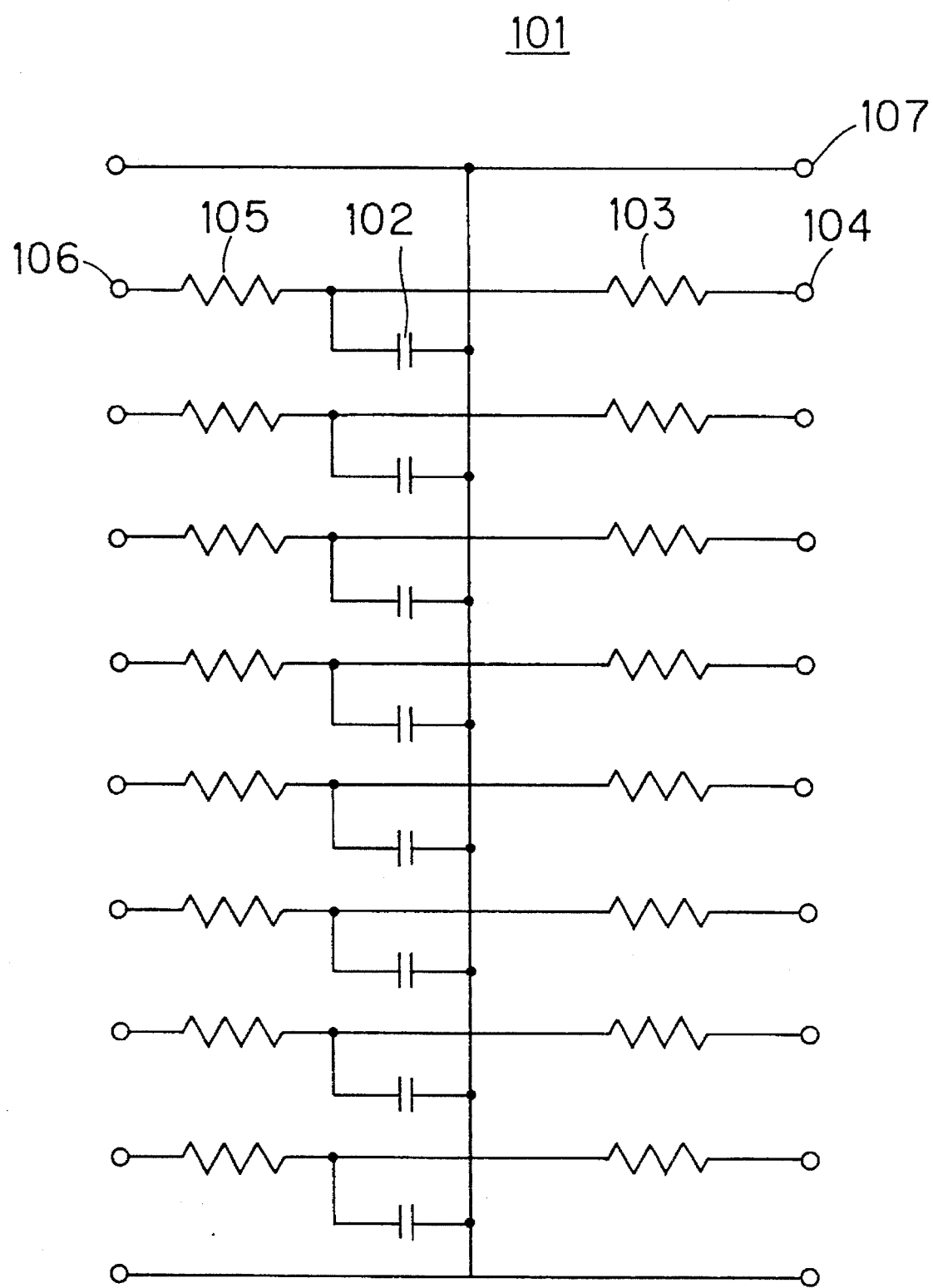
FIG. 13 is a circuit diagram of a filter array 101 defined by the RC array 110 shown in FIG. 9.

The as-formed RC array 110 defines a circuit which forms a filter array 101 shown in FIG. 13. Namely, the first and second capacitor electrodes 115 and 117 define capacitor elements 102, while the first resistor films 133 define first resistor elements 103 and the second resistor films 134 define second resistor elements 105. The first capacitor electrodes 115 being formed on the ceramic sheets 112b and 112d are connected with each other through the via holes 116 and 119, to be further electrically connected to the tap electrodes 113 through the via holes 114. The first ends of the first and second resistor films 133 and 134 are electrically connected to the tap electrodes 113 through the first and second land electrodes 129 and 130, respectively. The second ends of the first resistor films 133 are electrically connected to the first terminal electrodes 123 through the third land electrodes 131, while the second resistor films 134 are electrically connected to the second terminal electrodes 125 through the fourth land electrodes 132. The first and second terminal electrodes 123 and 125 define first and second terminals 104 and 106 appearing in FIG. 13, respectively. The second capacitor electrodes 117 formed on the ceramic sheets 112c and 112e are connected in common through the coupling conductors 118, to be further electrically connected to the ground terminal electrodes 124 and 126. The ground terminal electrodes 124 and 126 define ground terminals 107.

Such an RC array 110 can be formed as a chip component of 10 mm by 5 mm by 1 mm in size, for example.

Although the second capacitor electrodes 117 shown in FIG. 10 define comb shapes with the coupling conductors 118 as a whole, such second capacitor electrodes and coupling conductors may alternatively extend continuously in an unseparated manner, as shown in FIG. 5.

Further, the via holes 114, 116 and 119, which are employed for connecting the first capacitor electrodes 115 with each other as well as with the tap electrodes 113, may be replaced by through holes.

Figure 14:
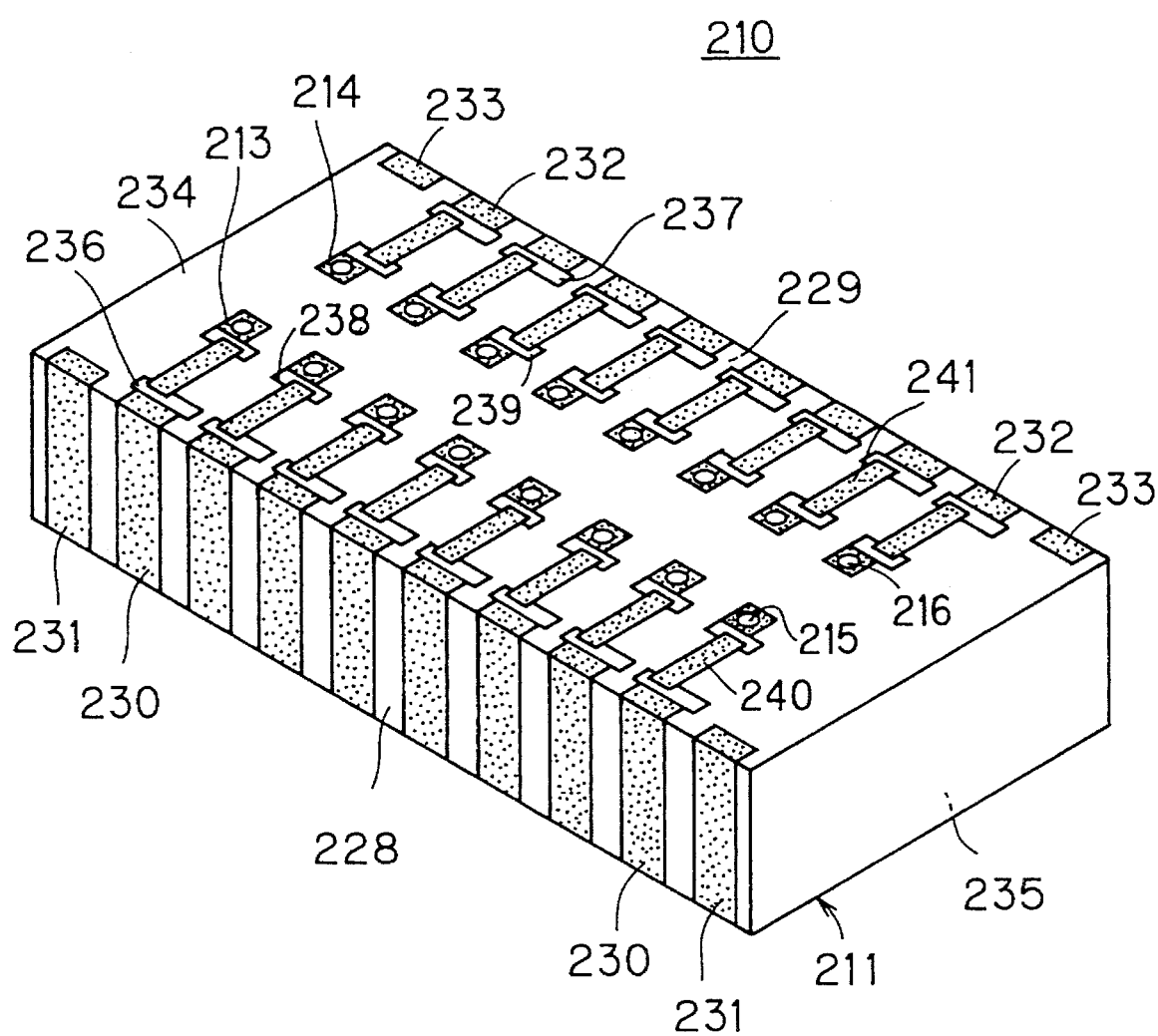
FIG. 14 is a perspective view showing an RC array 210 according to a further embodiment of the present invention.

FIGS. 14 to 17 area adapted to illustrate a further embodiment of the present invention. FIG. 14 is a perspective view showing the appearance of an RC array 210 according to this embodiment.

Figure 15:
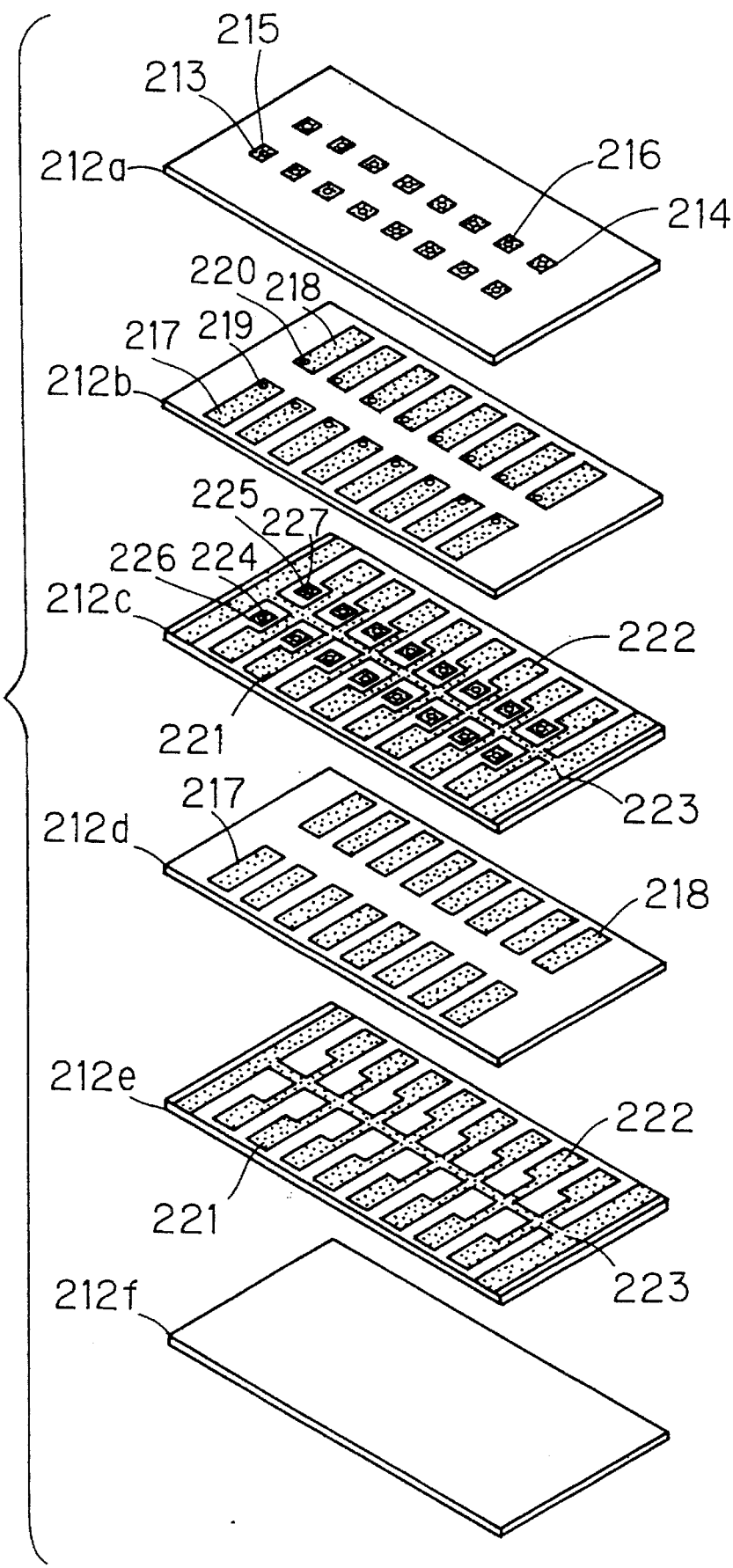
FIG. 15 is an exploded perspective view individually showing a plurality of ceramic sheets 212a to 212f forming a laminated ceramic block 211 shown in FIG. 14.

The RC array 210 comprises a laminated ceramic block 211, which is obtained by laminating a plurality of ceramic sheets 212a–212f as shown in FIG. 15.

A plurality of, e.g., eight, first tap electrodes 213 and a plurality of, e.g., eight, second tap electrodes 214 are formed on the ceramic sheet 212a, respectively. Via holes 215 and 216 are formed in the first and second tap electrodes 213 and 214, respectively. The tap electrodes 213 and 214 are formed by printing conductive paste materials, for example, and these conductive paste materials are also applied into the via holes 215 and 216 in the process of such printing.

On the ceramic sheet 212b, first capacitor electrodes 217 for first capacitor elements and third capacitor electrodes 218 for second capacitor elements are formed in a parallel manner in correspondence to the first and second tap electrodes 213 and 214, respectively. The first capacitor electrodes 217 are provided therein with via holes 219 corresponding to the via holes 215, while the third capacitor electrodes 218 are provided therein with via holes 220 corresponding to the via holes 216. The capacitor electrodes 217 and 218 are simultaneously formed by printing, for example, while conductive paste materials are also applied into the via holes 219 during the process of such printing.

On the ceramic sheet 212c, second capacitor electrodes 221 and fourth capacitor electrodes 222 are formed to be opposite to the first capacitor electrodes 217 and the third capacitor electrodes 218, thereby defining the first and second capacitor elements, respectively. The second and fourth capacitor electrodes 221 and 222 are connected in common by a coupling conductor 223. The coupling conductor 223 extends toward both side edges on both ends of the ceramic sheet 212c. Via holes 224 and 225 are provided on the ceramic sheet 212c in correspondence to the via holes 215 and 219 and the via holes 216 and 220, respectively, and via hole electrodes 226 and 227 are formed around the via holes 224 and 225, respectively. The capacitor electrodes 221 and 222 and the via hole electrodes 226 and 227 are simultaneously formed by printing, for example, and conductive paste materials are also applied into the via holes 224 and 225 in the process of such printing.

First and third capacitor electrodes 217 and 218 are formed on the ceramic sheet 212d, similarly to the ceramic sheet 212b. The capacitor electrodes 217 and 218 formed on the ceramic sheet 212d are provided with no via holes.

Second and fourth electrodes 221 and 222 and a coupling conductor 223 are formed on the ceramic sheet 212e, similarly to the ceramic sheet 212c. This ceramic sheet 212e is provided with no via holes and no via hole electrodes.

The ceramic sheet 212f is provided with no electrodes and no via holes.

Figure 16:
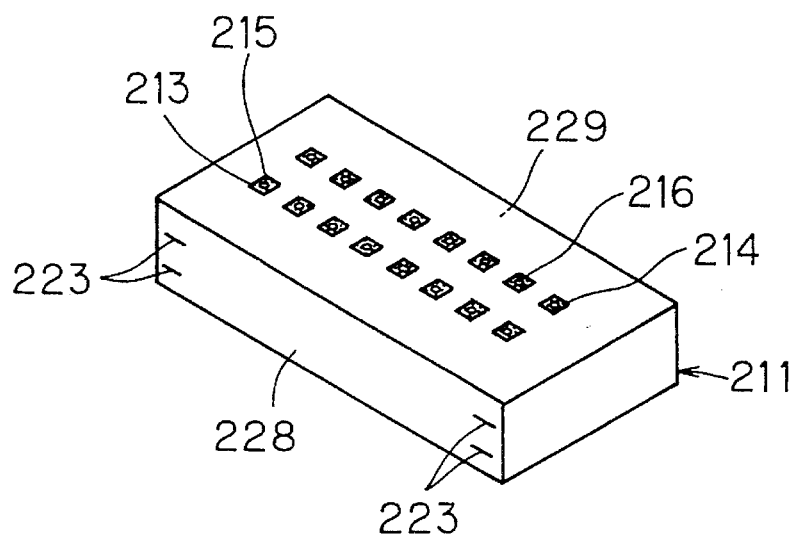
FIG. 16 is a perspective view showing the laminated ceramic block 211 obtained by laminating the ceramic sheets 212a to 212f shown in FIG. 15.

The ceramic sheets 212a–212f are laminated in the order shown in FIG. 15, and then brought into pressure contact with each other. FIG. 16 shows the as-obtained block 211. The coupling conductors 223 are exposed on a side surface 228 of the block 211, and the other ends (not shown) of the coupling conductors 223 are exposed on another side surface 229 which is opposite to the side surface 228. The block 211 is fired at a temperature of 1200° to 1300° C., for example, to provide a sintered body.

In order to obtain the block 211, the ceramic sheets 212b and 212c, for example, may be omitted so that the first capacitor elements are defined simply by single pairs of the first and second capacitor electrodes 217 and 21 and the second capacitor elements are defined simply by single pairs of the third and fourth capacitor elements 218 and 222. Alternatively, ceramic sheets corresponding to the ceramic sheets 212b and 212c may be further laminated in order to increase the numbers of pairs of the first and second capacitor elements 217 and 221 defining the first capacitor elements and the third and fourth capacitor elements 218 and 222 defining the second capacitor elements.

Figure 17:
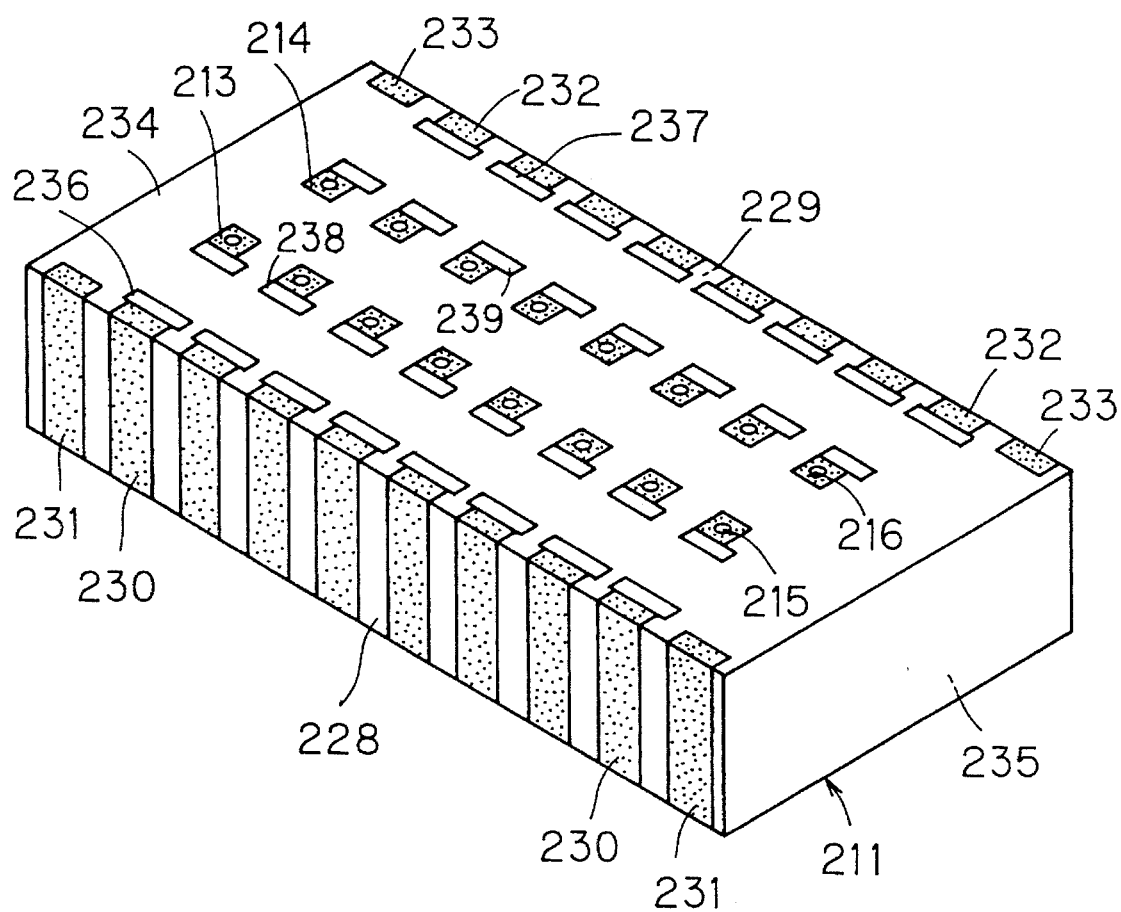
FIG. 17 is a perspective view showing terminal electrodes 230 to 233 formed on outer surfaces of the laminated ceramic block 211 shown in FIG. 16.

Then, a plurality of, e.g., eight, first terminal electrodes 230 and two ground terminal electrodes 231 are formed on the side surface 228 of the block 211, as shown in FIG. 17. On the other hand, a plurality of, e.g., eight, second terminal electrodes 232 and two ground terminal electrodes 233 are formed on the side surface 229 of the block 211. The terminal electrodes 230, 231, 232 and 233 are preferably formed to partially extend toward opposite major surfaces 234 and 235 of the block 221. The first major surface 234 of the block 211 is provided with first land electrodes 236, second land electrodes 237, third land electrodes 238 and fourth land electrodes 239 to be electrically connected to the first terminal electrodes 230, the second terminal electrodes 232, the first tap electrodes 213 and the second tap electrodes 214 respectively. The electrodes 230–233 and 236–239 are formed by printing proper conductive paste materials and baking the same. The land electrodes 236–239 may be formed in any stage before or after formation of the tap electrodes 213 and 214 and the terminal electrodes 230–233, or the land electrodes 236–239 may alternatively be omitted.

Then, first and second resistor films 240 and 241 are formed to extend between the first and second land electrodes 236 and 237 and the corresponding ones of the third and fourth land electrodes 238 and 239, respectively, as shown in FIG. 14. The resistor films 240 and 241 are formed by printing cermet materials, for example, and baking the same. These resistor films 240 and 241 are trimmed if necessary, while the same may be covered with overcoats of resin, for example.

Figure 18:
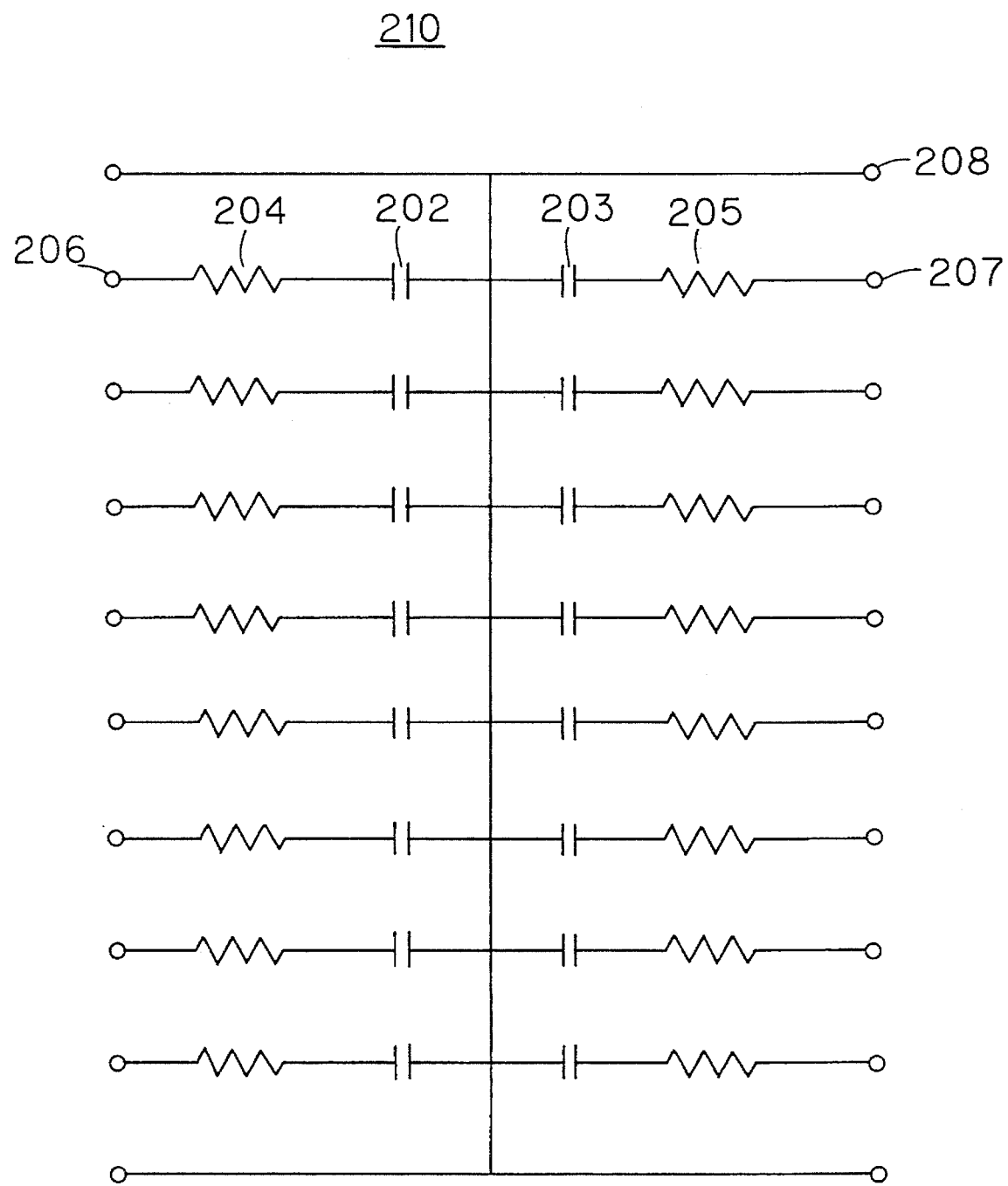
FIG. 18 is a circuit diagram of a filter array 201 defined by the RC array shown in FIG. 14.

The as-formed RC array 210 defines a circuit which forms a filter array 201 shown in FIG. 18. Namely, the first and second capacitor electrodes 217 and 221 define first capacitor elements 202, while the third and fourth capacitor electrodes 218 and 222 define second capacitor elements 203. The first and second resistor films 240 and 241 define first and second resistor elements 204 and 205, respectively. The first capacitor electrodes 217 are electrically connected with each other through the via holes 219 and 224, while the same are also electrically connected to the first tap electrodes 213 through the via holes 215. The first resistor films 240 are electrically connected to the first tap electrodes 213 through the third land electrodes 238, while the first terminal electrodes 230 are electrically connected to the first resistor films 240 through the first land electrodes 236. The first terminal electrodes 230 define first terminals 206. On the other hand, the third capacitor electrodes 218 are electrically connected with each other through the via holes 220 and 225, while the same are also electrically connected to the second tap electrodes 214 through the via holes 216. The second resistor films 241 are electrically connected to the second tap electrodes 214 through the third land electrodes 239, while the second terminal electrodes 232 are electrically connected to the second resistor films 241 through the second land electrodes 237. The second terminal electrodes 232 define second terminals 207. The second and fourth capacitor electrodes 221 and 222 are connected in common through the coupling conductors 223, to be electrically connected to the ground terminal electrodes 231 and 233, which define ground terminals 208.

Such an RC array 210 can be formed as a chip component of 10 mm by 5 mm by 1 mm in size, for example.

The second capacitor electrodes 221 formed on the ceramic sheets 212c and 212e as shown in FIG. 15 may alternatively extend continuously in an unseparated manner, as shown in FIG. 5, to serve also as parts of coupling capacitors. This also applies to the fourth capacitor electrodes 222.

The via holes 215, 219 and 224 and 216, 220 and 225 may be replaced by through holes, respectively.

All of the aforementioned RC arrays 10, 10a, 110 and 210 are surface-mountable. However, the present invention is not restricted to a surface-mountable RC array, and hence the laminated ceramic block may not be in the form of a rectangular parallelopiped, while various terminal electrodes may be formed on portions other than side surfaces of a block which is in the form of a rectangular parallelopiped.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. An RC array comprising:
    a laminated ceramic block formed of a plurality of ceramic sheets;
    a plurality of capacitor elements each having at least one pair of first and second capacitor electrodes disposed opposite to each other in the interior of said block, each of said first capacitor electrodes being formed on at least one of said plurality of ceramic sheets and each of said second capacitor electrodes being formed on at least one of said plurality of ceramic sheets that does not have said first capacitor electrodes formed thereon;
    a plurality of first terminal electrodes, each being formed on an outer surface of said block to be electrically connected to one of said first capacitor electrodes of said plurality of capacitor elements;
    a plurality of resistor films, each being formed on an outer surface of said block and having a first end electrically connected to one of said plurality of first terminal electrodes;
    a plurality of second terminal electrodes, each being formed on an outer surface of said block to be electrically connected to a second end of one of said plurality of resistor films;
    a coupling conductor connecting said second capacitor electrodes of said plurality of capacitor elements in common; and
    a ground terminal electrode being formed on an outer surface of said block to be electrically connected to said coupling conductor; wherein
    said coupling conductor is formed on said at least one of said plurality of ceramic sheets on which said second capacitor electrodes are formed;
    said plurality of capacitor elements, said plurality of first terminal electrodes, said plurality of second terminal electrodes and said plurality of resistor films are connected to form a plurality of separate and independently operable filter circuits, each of the filter circuits comprises an RC circuit including one of the plurality of resistor films and one of the plurality of capacitor elements, each of the plurality of filter circuits being connected by the coupling conductor to the ground terminal electrode to connect each of the filter circuits to a common ground.

2. An RC array in accordance with claim 1, wherein
    said block has a pair of major surfaces disposed parallel to each other and four side surfaces extending in directions perpendicular to said major surfaces, and
    said first terminal electrodes, said second terminal electrodes and said ground terminal electrode include portions extending on at least one of said four side surfaces,
    said resistor films being formed on one of said major surfaces.

3. An RC array comprising:
    a laminated ceramic block formed of a plurality of ceramic sheets;
    a plurality of capacitor elements each having at least one pair of first and second capacitor electrodes disposed opposite to each other in the interior of said block, each of said first capacitor electrodes being formed on at least one of said plurality of ceramic sheets and each of said second capacitor electrodes being formed on at least one of said plurality of ceramic sheets that does not have said first capacitor electrodes formed thereon;
    a plurality of tap electrodes, each being formed on an outer surface of said block to be electrically connected to one of said first capacitor electrodes of one of said plurality of capacitor elements;
    a plurality of first resistor films and a plurality of second resistor films, each being formed on an outer surface of said block and having a first end electrically connected to one of said plurality of tap electrodes;
    a plurality of first terminal electrodes, each being formed on an outer surface of said block to be electrically connected to a second end of one of said plurality of first resistor films;
    a plurality of second terminal electrodes, each being formed on an outer surface of said block to be electrically connected to a second end of one of said plurality of second resistor films;
    a coupling conductor connecting said second capacitor electrodes of said plurality of capacitor elements in common; and
    a ground terminal electrode being formed on an outer surface of said block to be electrically connected to said coupling conductor; wherein
    said coupling conductor is formed on said at least one of said plurality of ceramic sheets on which said second capacitor electrodes are formed;
    said plurality of capacitor elements, said plurality of tap electrodes, said plurality of first terminal electrodes, said plurality of second terminal electrodes and said plurality of first and second resistor films are connected to form a plurality of separate and independently operable filter circuits, each of the filter circuits comprises an RC circuit including one of the first resistor films, one of the second resistor films and one of the plurality of capacitor elements, each of the plurality of filter circuits being connected by the coupling conductor to the ground terminal electrode to connect each of the filter circuits to a common ground.

4. An RC array in accordance with claim 3, wherein
said block has a pair of major surfaces disposed parallel to each other and four side surfaces extending in directions perpendicular to said major surfaces, said first terminal electrodes, said second terminal electrodes and said ground terminal electrode include portions extending on at least one of said four side surfaces, and said tap electrodes and said first and second resistor films are formed on one of said major surfaces, each of said tap electrodes being electrically connected with one of said first capacitor electrodes by an internal conductor extending at least from the interior of said block toward said one of said major surfaces.

5. An RC array in accordance with claim 3, further comprising a connector for electrically connecting each of said first capacitor electrodes with one of said tap electrodes, said connector including a via hole coupler provided in the interior of said block.

6. An RC array comprising:

a laminated ceramic block formed of a plurality of sheets;

a plurality of first capacitor elements each having at least one pair of first and second capacitor electrodes disposed opposite to each other in the interior of said block, each of said first capacitor electrodes being formed on at least one of said plurality of ceramic sheets and each of said second capacitor electrodes being formed on at least one of said plurality of sheets that does not have said first capacitor electrodes formed thereon;

a plurality of second capacitor elements each having at least one pair of third and fourth capacitor electrodes disposed opposite to each other in the interior of said block, each of said third capacitor electrodes being formed on at least one of said plurality of ceramic sheets and each of said fourth capacitor electrodes being formed on at least one of said plurality of sheets that does not have said third capacitor electrodes formed thereon;

a plurality of first tap electrodes, each being formed on an outer surface of said block to be electrically connected to one of said first capacitor electrodes of one of said plurality of first capacitor elements;

a plurality of first resistor films, each being formed on an outer surface of said block and having a first end electrically connected to one of said plurality of first tap electrodes;

a plurality of first terminal electrodes, each being formed on an outer surface of said block to be electrically connected to a second end of one of said plurality of first resistor films;

a plurality of second tap electrodes, each being formed on an outer surface of said block to be electrically connected to one of said third capacitor elements of one of said plurality of second capacitor elements;

a plurality of second resistor films, each being formed on an outer surface of said block and having a first end electrically connected to one of said plurality of second tap electrodes;

a plurality of second terminal electrodes each being formed on an outer surface of said block to be electrically connected to a second end of one of said plurality of second resistor films;

a coupling conductor connecting said second capacitor electrodes of said plurality of first capacitor elements and said fourth capacitor electrodes of said second capacitor elements in common; and a ground terminal electrode being formed on an outer surface of said block to be electrically connected to said coupling conductor; wherein said second terminal electrodes, said fourth terminal electrodes and said coupling conductor are formed on the same ceramic sheet;

said plurality of first and second capacitor elements, said plurality of first and second tap electrodes, said plurality of first and second terminal electrodes and said plurality of first and second resistor films are connected to form a plurality of separate and independently operable filter circuits, each of the filter circuits comprises an RC circuit including one of the first resistor films, one of the second resistor films, one of the first capacitor elements and one of the second capacitor elements, each of the plurality of filter circuits being connected by the coupling conductor to the ground terminal electrode to connect each of the filter circuits to a common ground.

7. An RC array in accordance with claim 6, wherein
said block has a pair of major surfaces disposed parallel to each other and four side surfaces extending in directions perpendicular to said major surfaces, said first terminal electrodes, said second terminal electrodes and said ground terminal electrode include portions extending on at least one of said four side surfaces, said first and second tap electrodes and said first and second resistor films are formed on one of said major surfaces, each of said first tap electrodes are electrically connected with one of said first capacitor electrodes by a first internal conductor extending at least from the interior of said block toward said one of said major surfaces, and each of said second tap electrodes being electrically connected with one of said third capacitor electrodes by a second internal conductor extending at least from the interior of said block toward said one of said major surfaces.

8. An RC array in accordance with claim 6, further comprising a first connector for electrically connecting each of said first capacitor electrodes with one of said first tap electrodes, said first connector including a first via hole coupler provided in the interior of said block, and a second connector for electrically connecting each of said third capacitor electrodes with one of said second tap electrodes, said second connector including a second via hole coupler provided in the interior of said block.

9. An RC array comprising:

a) a laminated ceramic block formed of a plurality of ceramic sheets;

b) a plurality of separate and independently operable filter circuits, each of the filter circuits comprises an RC circuit and includes:

1) a capacitor element having a first capacitor electrode and a second capacitor electrode disposed opposite to each other in the interior of said block, the first capacitor electrode being formed on at least one of said plurality of ceramic sheets and the second capacitor electrode being formed on at least one of said plurality of ceramic sheets that does not have said first capacitor electrode formed thereon;

2) a first terminal electrode formed on an outer surface of said block to be electrically connected to said first capacitor electrode;

3) a second terminal electrode formed on an outer surface of said block;

4) a resistor film formed on an outer surface of said block and having a first end electrically connected to said first terminal electrode and a second end electrically connected to said second terminal electrode;

c) a coupling conductor formed on said one of said plurality of ceramic sheets on which said second capacitor electrode is formed for connecting said second capacitor electrode of each filter circuit to connect each capacitor element of each filter circuit in common; and d) a ground terminal electrode being formed on an outer surface of said block to be electrically connected to said coupling conductor to connect each filter circuit to a common ground.

* * * * *